(12) United States Patent
Lv

(10) Patent No.: US 9,806,106 B2
(45) Date of Patent: Oct. 31, 2017

(54) THIN FILM TRANSISTOR ARRAY SUBSTRATE AND MANUFACTURE METHOD THEREOF

(71) Applicant: Shenzhen China Star Optoelectronics Technology Co., Ltd., Shenzhen (CN)

(72) Inventor: Xiaowen Lv, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 24 days.

(21) Appl. No.: 14/763,818

(22) PCT Filed: May 21, 2015

(86) PCT No.: PCT/CN2015/079421
§ 371 (c)(1),
(2) Date: Jul. 27, 2015

(87) PCT Pub. No.: WO2016/173012
PCT Pub. Date: Nov. 3, 2016

(65) Prior Publication Data
US 2016/0315106 A1    Oct. 27, 2016

(30) Foreign Application Priority Data

Apr. 27, 2015  (CN) .......................... 2015 1 0206317

(51) Int. Cl.
*H01L 27/12*  (2006.01)
*H01L 29/786*  (2006.01)
(Continued)

(52) U.S. Cl.
CPC ...... *H01L 27/1255* (2013.01); *H01L 27/1225* (2013.01); *H01L 27/1259* (2013.01);
(Continued)

(58) Field of Classification Search
CPC ............. H01L 27/1255; H01L 27/1225; H01L 27/1259; H01L 29/4908; H01L 29/517; H01L 29/66969; H01L 29/7869
(Continued)

(56) References Cited

U.S. PATENT DOCUMENTS 4,885,616 A * 12/1989 Ohta ................. H01L 29/78669
257/59
5,053,347 A * 10/1991 Wu .................... H01L 29/78648
257/57
(Continued)

*Primary Examiner* — Ori Nadav
(74) *Attorney, Agent, or Firm* — Leong C. Lei

(57) ABSTRACT

The present invention provides a thin film transistor array substrate and a manufacture method thereof, comprising: a substrate (1) and a thin film transistor and a storage capacitor formed on the substrate (1); the storage capacitor comprises a first electrode plate (31) on the substrate (1), a gate isolation layer (31) or an etching stopper layer (5) on the first electrode plate (31), a second electrode plate (32) on the gate isolation layer (3) or the etching stopper layer (5); there is only one isolation layer, which is the gate isolation layer or the etching stopper layer, existing between the two electrode plates of the storage capacitor in the aforesaid thin film transistor array substrate, the isolation layer thickness of the storage capacitor is thinner, and relatively, the capacitor occupies a smaller area and possesses a higher aperture ratio.

10 Claims, 3 Drawing Sheets

(51) Int. Cl.
  *H01L 29/51* (2006.01)
  *H01L 29/49* (2006.01)
  *H01L 29/66* (2006.01)

(52) U.S. Cl.
  CPC ........ *H01L 29/4908* (2013.01); *H01L 29/517* (2013.01); *H01L 29/66969* (2013.01); *H01L 29/7869* (2013.01)

(58) Field of Classification Search
  USPC .......................................................... 257/43
  See application file for complete search history.

(56) References Cited

U.S. PATENT DOCUMENTS

| | | | | |
|---|---|---|---|---|
| 5,075,244 A * | 12/1991 | Sakai | ...................... | H01L 21/84 257/59 |
| 6,593,592 B1 * | 7/2003 | Yamazaki | ........... | H01L 27/1237 257/59 |
| 7,206,033 B2 * | 4/2007 | Yoo | ................... | G02F 1/136213 349/138 |
| 2003/0001493 A1 * | 1/2003 | Park | ..................... | G09G 3/3225 313/504 |
| 2005/0285197 A1 * | 12/2005 | Park | ................... | H01L 29/4908 257/347 |
| 2006/0289867 A1 * | 12/2006 | Lim | ..................... | H01L 27/124 257/59 |

* cited by examiner

THIN FILM TRANSISTOR ARRAY SUBSTRATE AND MANUFACTURE METHOD THEREOF

FIELD OF THE INVENTION

The present invention relates to a flat panel display field, and more particularly to a thin film transistor array substrate and a manufacture method thereof.

BACKGROUND OF THE INVENTION

The active matrix panel display elements possess many merits of thin frame, power saving, no radiation, etc. and have been widely used. In the present market, the flat panel display comprises Liquid Crystal Displays (LCD) and Organic Light Emitting Diodes (OLED).

The LCD comprises a liquid crystal display panel and a backlight module. The working principle of the liquid crystal display panel is to locate liquid crystal molecules between two parallel glass substrates. The light of back light module is reflected to generate images by applying driving voltages to control whether the liquid crystal molecules to be changed directions.

An OLED possesses properties of self-illumination, high brightness, wide view angle, high contrast, flexibility and low power consumption, etc., and accordingly has been received more attentions. As being the display of next generation, it has been gradually replaced traditional liquid crystal displays and widely applied in cellular phone screens, computer displays, full color TV, etc. OLED display technology is different from the traditional liquid crystal display technology and the back light is not required. It utilizes an ultra thin organic material coating layer and a glass substrate, and theses organic material will illuminate when the current is conducted.

The Thin Film Transistor Array substrate has been widely applied in LCD and OLED, which generally comprises a glass substrate and a thin film transistor and a storage capacitor formed on the glass substrate.

The storage capacitor plays a role having the important functions of maintaining voltage level, reducing the coupling capacitor dividing voltage. Generally, we prefer a larger capacitance. The calculation of the capacitance is $C = \in S/D$, wherein S represents the area, and D represents the isolation layer thickness. To change the value of the storage capacitor, several methods are listed, 1. Selecting the isolation material with a larger dielectric constant. 2. Increasing the area. 3. Reducing the isolation layer thickness.

Generally, enlarging the relative area of the two metal plates will increase the capacitance. However, the storage capacitor is commonly manufactured by clamping the isolation layer. The metal electrode is opaque. The larger the storage capacitor is, the lower the aperture ratio becomes. Reducing the isolation layer thickness can increase the value of the storage capacitor, and on this basis, the relative area of the metal plates can be properly reduced, which is a better method of increasing the storage capacitor and raising the aperture ratio.

Please refer to FIG. 1, which is a sectional structure diagram of a thin film transistor array substrate according to prior art, comprising a substrate 100, and a thin film transistor and a storage capacitor formed on the substrate 100. The first electrode plate 310 and the second electrode plate 320 of the storage capacitor clamp the gate isolation layer 300 and the etching stopper layer 500 inbetween. Because both the gate isolation layer 300 and the etching stopper layer 500 possess a certain thickness, which makes that the isolation layer is thicker, then, the storage capacitor is smaller. The larger relative area is required for obtaining the thetic capacitance value. Therefore, the element aperture ratio is reduced.

SUMMARY OF THE INVENTION

An objective of the present invention is to provide a thin film transistor array substrate, possessing higher an aperture ratio while as having a larger storage capacitor.

An objective of the present invention is to provide a manufacture method of a thin film transistor array substrate for raising the aperture ratio while enlarging the storage capacitor.

For realizing the aforesaid objectives, the present invention provides a thin film transistor array substrate, comprising a substrate and a thin film transistor and a storage capacitor formed on the substrate;

the storage capacitor comprises a first electrode plate on the substrate, a gate isolation layer or an etching stopper layer on the first electrode plate, a second electrode plate on the gate isolation layer or the etching stopper layer.

The thin film transistor array substrate comprises a substrate, a first gate, a second gate and a first electrode plate at one side of the second gate away from the first gate positioned on the substrate, a gate isolation layer positioned on the first gate, the second gate, the first electrode plate and the substrate, a first oxide semiconductor layer and a second oxide semiconductor layer respectively above the first gate and the second gate positioned on the gate isolation layer, a second electrode plate above the first electrode plate positioned on the gate isolation layer, an etching stopper layer positioned on the first oxide semiconductor layer, the second oxide semiconductor layer and the gate isolation layer, a first source, a first drain, a second source, a second drain respectively above the first gate and the second gate positioned on the etching stopper layer, a passivation layer positioned above the first source, the first drain, the second source, the second drain and the second electrode plate covering the etching stopper layer, a flat layer positioned on the passivation layer, a pixel electrode layer positioned on the flat layer, a pixel definition layer positioned on the flat layer and the pixel electrode layer and a photospacer positioned on the pixel definition layer;

the gate isolation layer is provided with a first via hole correspondingly above the second gate close to one side of the first gate, and the passivation layer and the flat layer are provided with a second via hole correspondingly above the second source, and the pixel definition layer is provided with a third via hole correspondingly above the pixel electrode layer; the first source, the first drain contact with the first oxide semiconductor layer, and the second source and the second drain contact with the second oxide semiconductor layer, and the first source contacts with the second gate through the first via hole, and the pixel electrode layer contacts with the second source through the second via hole, and the third via hole exposes a portion of the pixel electrode layer;

the first gate, the second gate, the gate isolation layer, the first oxide semiconductor layer, the second oxide semiconductor layer, the etching stopper layer, the first source, the first drain, the second source and the second drain construct a thin film transistor; the first electrode plate, the second electrode plate and the gate isolation layer between the first electrode plate and the second electrode plate construct a storage capacitor.

The thin film transistor array substrate comprises a substrate, a first gate, a second gate and a first electrode plate at one side of the second gate away from the first gate positioned on the substrate, a gate isolation layer positioned on the first gate, the second gate and the substrate, a first oxide semiconductor layer and a second oxide semiconductor layer respectively above the first gate and the second gate positioned on the gate isolation layer, an etching stopper layer positioned on the first oxide semiconductor layer, the second oxide semiconductor layer, the gate isolation layer and the first electrode plate, a second electrode plate above the first electrode plate positioned on the etching stopper layer, a first source, a first drain, a second source, a second drain respectively above the first gate and the second gate positioned on the etching stopper layer, a passivation layer positioned above the first source, the first drain, the second source, the second drain and the second electrode plate covering the etching stopper layer, a flat layer positioned on the passivation layer, a pixel electrode layer positioned on the flat layer, a pixel definition layer positioned on the flat layer and the pixel electrode layer and a photospacer positioned on the pixel definition layer;

the gate isolation layer is provided with a first via hole correspondingly above the second gate close to one side of the first gate, and the passivation layer and the flat layer are provided with a second via hole correspondingly above the second source, and the pixel definition layer is provided with a third via hole correspondingly above the pixel electrode layer; the first source, the first drain contact with the first oxide semiconductor layer, and the second source and the second drain contact with the second oxide semiconductor layer, and the first source contacts with the second gate through the first via hole, and the pixel electrode layer contacts with the second source through the second via hole, and the third via hole exposes a portion of the pixel electrode layer;

the first gate, the second gate, the gate isolation layer, the first oxide semiconductor layer, the second oxide semiconductor layer, the etching stopper layer, the first source, the first drain, the second source and the second drain construct a thin film transistor; the first electrode plate, the second electrode plate and the etching stopper layer between the first electrode plate and the second electrode plate construct a storage capacitor.

Material of the gate isolation layer and material of the etching stopper layer are different.

Material of the gate isolation layer is $Al_2O_3$, and material of the etching stopper layer is SiOx.

Material of the gate isolation layer is SiOx, and material of the etching stopper layer is $Al_2O_3$.

The present invention further provides a manufacture method of a thin film transistor array substrate, comprising steps of:

step 1, providing a substrate and deposing a first metal layer on the substrate, and implementing pattern process to the first metal layer to obtain a first gate, a second gate and a first electrode plate positioned at one side of the second gate away from the first gate;

step 2, deposing and patterning a gate isolation layer on the first metal layer to obtain a first via hole positioned above the second gate close to one side of the first gate;

step 3, deposing and patterning an oxide semiconductor layer on the gate isolation layer to respectively obtain a first oxide semiconductor layer positioned above the first gate and a second oxide semiconductor layer positioned above the second gate;

step 4, deposing an etching stopper layer on the oxide semiconductor layer, and implementing pattern process to the etching stopper layer to respectively expose the two side areas of the first oxide semiconductor layer and the second oxide semiconductor layer, and meanwhile etching the partially etching stopper layer above the first electrode plate;

step 5, deposing a second metal layer on the etching stopper layer and the gate isolation layer, and implementing pattern process to the second metal layer to respectively obtain a first source and a first drain above the first gate, a second source and a second drain above the second gate, a second electrode plate above the first electrode plate;

the first source and the first drain contact with the two side areas of the first oxide semiconductor layer, and the second source and the second drain contact with the two side areas of the second oxide semiconductor layer, and the first source contacts with the second gate through the first via hole;

step 6, sequentially forming a passivation layer, a flat layer, a pixel electrode layer, a pixel definition layer and a photospacer on the second metal layer and the etching stopper layer;

the passivation layer and the flat layer are formed with a second via hole correspondingly above the second source, and the pixel definition layer is formed with a third via hole correspondingly above the pixel electrode layer; the pixel electrode layer contacts with the second source through the second via hole, and the third via hole exposes a portion of the pixel electrode layer.

The gate isolation layer and the etching stopper layer are formed with different materials.

The gate isolation layer is formed by $Al_2O_3$ and the etching stopper layer is formed by SiOx.

The gate isolation layer is formed by SiOx and the etching stopper layer is formed by $Al_2O_3$.

The present invention further provides a manufacture method of a thin film transistor array substrate, comprising steps of:

step 1, providing a substrate and deposing a first metal layer on the substrate, and implementing pattern process to the first metal layer to obtain a first gate, a second gate and a first electrode plate positioned at one side of the second gate away from the first gate;

step 2, deposing and patterning a gate isolation layer on the first metal layer to obtain a first via hole positioned above the second gate close to one side of the first gate;

step 3, deposing and patterning an oxide semiconductor layer on the gate isolation layer to respectively obtain a first oxide semiconductor layer positioned above the first gate and a second oxide semiconductor layer positioned above the second gate;

step 4, deposing an etching stopper layer on the oxide semiconductor layer, and implementing pattern process to the etching stopper layer to respectively expose the two side areas of the first oxide semiconductor layer and the second oxide semiconductor layer, and meanwhile etching the etching stopper layer above the first electrode plate;

step 5, deposing a second metal layer on the etching stopper layer and the gate isolation layer, and implementing pattern process to the second metal layer to respectively obtain a first source and a first drain above the first gate, a second source and a second drain above the second gate, a second electrode plate above the first electrode plate;

the first source and the first drain contact with the two side areas of the first oxide semiconductor layer, and the second source and the second drain contact with the two side areas of the second oxide semiconductor layer, and the first source contacts with the second gate through the first via hole;

step 6, sequentially forming a passivation layer, a flat layer, a pixel electrode layer, a pixel definition layer and a photospacer on the second metal layer and the etching stopper layer;

the passivation layer and the flat layer are formed with a second via hole correspondingly above the second source, and the pixel definition layer is formed with a third via hole correspondingly above the pixel electrode layer; the pixel electrode layer contacts with the second source through the second via hole, and the third via hole exposes a portion of the pixel electrode layer;

wherein the gate isolation layer and the etching stopper layer are formed with different materials;

wherein the gate isolation layer is formed by $Al_2O_3$ and the etching stopper layer is formed by SiOx.

The benefits of the present invention are: as regarding the thin film transistor array substrate provided by the present invention, because there is only one isolation layer, which is the gate isolation layer or the etching stopper layer, existing between the two electrode plates of the storage capacitor in the aforesaid thin film transistor array substrate, the isolation layer thickness of the storage capacitor is thinner, and relatively, the capacitor occupies a smaller area and possesses a higher aperture ratio. In the manufacture method of the thin film transistor array substrate according to the present invention, as etching the etching stopper layer, the portion of the etching stopper layer on the first electrode plate is etched, and thus, the isolation layer thickness of the storage capacitor can be decreased, and relatively, the capacitor occupies a smaller area and possesses a higher aperture ratio; meanwhile, because the gate isolation layer and the etching stopper layer are formed by different materials, and the etching gas is passive to the gate isolation layer for preventing the damage to the gate isolation layer under in the process of etching the etching stopper layer, it can be ensured to obtain an ideal storage capacitor.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
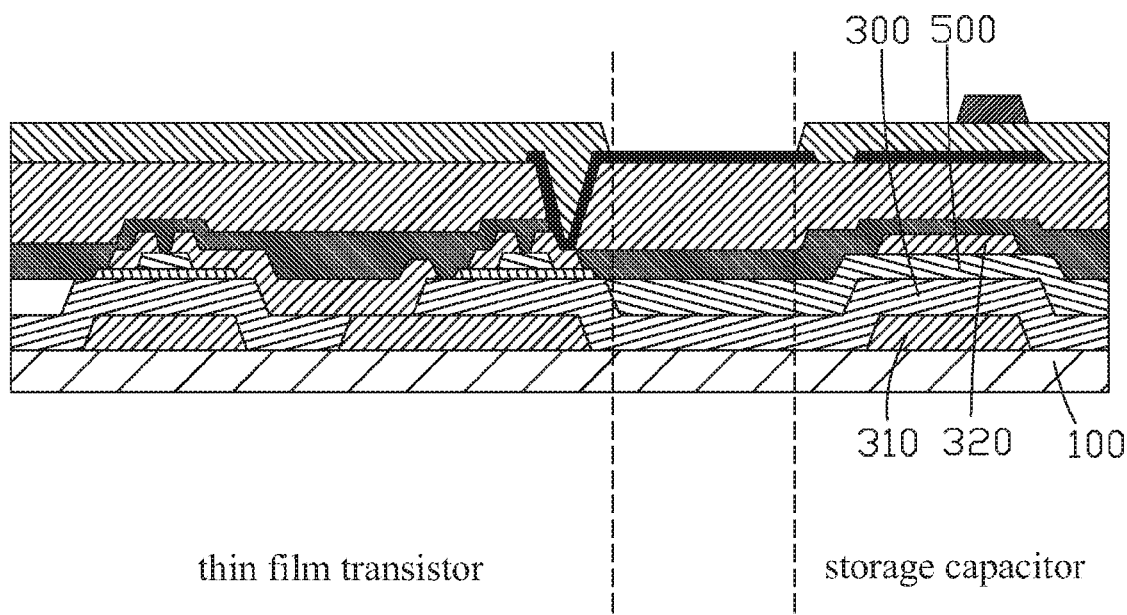
FIG. 1 is a sectional structure diagram of a thin film transistor array substrate according to prior art.
Figure 2:
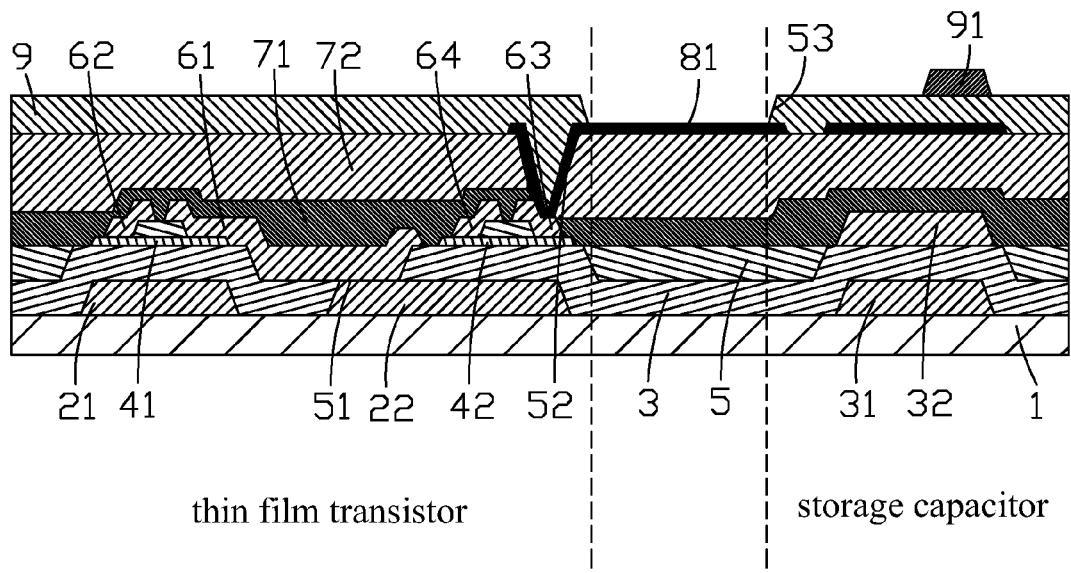
FIG. 2 is a sectional structure diagram of the first embodiment of a thin film transistor array substrate according to the present invention.
Figure 3:
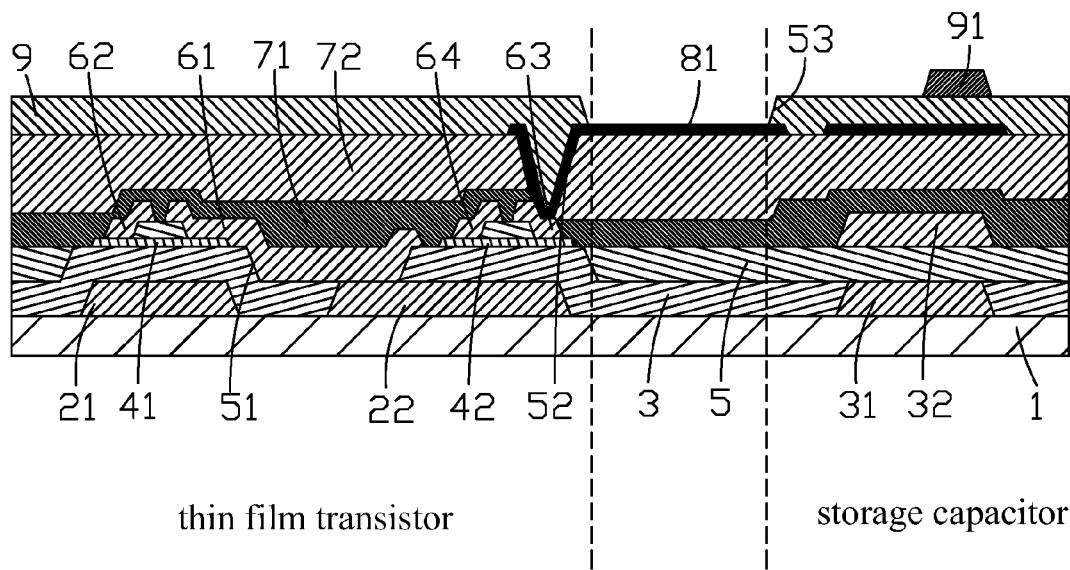
FIG. 3 is a sectional structure diagram of the second embodiment of a thin film transistor array substrate according to the present invention.

Please refer to FIG. 2 to FIG. 3. The present invention provides a thin film transistor array substrate, comprising a substrate 1 and a thin film transistor and a storage capacitor formed on the substrate 1.

The storage capacitor comprises a first electrode plate 31 on the substrate 1, a gate isolation layer 3 or an etching stopper layer 5 on the first electrode plate 31, a second electrode plate 32 on the gate isolation layer 3 or an etching stopper layer 5.

As shown in FIG. 2 which is a structure diagram of the first embodiment of the thin film transistor array substrate according to the present invention, comprising a substrate 1, a first gate 21, a second gate 22 and a first electrode plate 31 at one side of the second gate 22 away from the first gate 21 positioned on the substrate 1, a gate isolation layer 3 positioned on the first gate 21, the second gate 22, the first electrode plate 31 and the substrate 1, a first oxide semiconductor layer 41 and a second oxide semiconductor layer 42 respectively above the first gate 21 and the second gate 22 positioned on the gate isolation layer 3, a second electrode plate 32 above the first electrode plate 31 positioned on the gate isolation layer 3, an etching stopper layer 5 positioned on the first oxide semiconductor layer 41, the second oxide semiconductor layer 42 and the gate isolation layer 3, a first source 61, a first drain 62, a second source 63, a second drain 64 respectively above the first gate 21 and the second gate 22 positioned on the etching stopper layer 5, a passivation layer 71 positioned above the first source 61, the first drain 62, the second source 63, the second drain 64 and the second electrode plate 32 covering the etching stopper layer 5, a flat layer 72 positioned on the passivation layer 71, a pixel electrode layer 81 positioned on the flat layer 72, a pixel definition layer 9 positioned on the flat layer 72 and the pixel electrode layer 81 and a photospacer 91 positioned on the pixel definition layer 9.

The gate isolation layer 3 is provided with a first via hole 51 correspondingly above the second gate 22 close to one side of the first gate 21, and the passivation layer 71 and the flat layer 72 are provided with a second via hole 52 correspondingly above the second source 63, and the pixel definition layer 9 is provided with a third via hole 53 correspondingly above the pixel electrode layer 81; the first source 61, the first drain 62 contact with the first oxide semiconductor layer 41, and the second source 63 and the second drain 64 contact with the second oxide semiconductor layer 42, and the first source 61 contacts with the second gate 22 through the first via hole 51, and the pixel electrode layer 81 contacts with the second source 63 through the second via hole 52, and the third via hole 53 exposes a portion of the pixel electrode layer 81.

The first gate 21, the second gate 22, the gate isolation layer 3, the first oxide semiconductor layer 41, the second oxide semiconductor layer 42, the etching stopper layer 5, the first source 61, the first drain 62, the second source 63 and the second drain 64 construct a thin film transistor; the first electrode plate 31, the second electrode plate 32 and the gate isolation layer 3 between the first electrode plate 31 and the second electrode plate 32 construct a storage capacitor.

Because there is only one isolation layer, the gate isolation layer 3 existing between the two electrode plates of the storage capacitor, the isolation layer thickness of the storage capacitor is thinner, and relatively, the capacitor occupies a smaller area and possesses a higher aperture ratio.

Specifically, the gate isolation layer 3 and the etching stopper layer 5 are formed by different materials; for example, the gate isolation layer 3 is formed by $Al_2O_3$ and the etching stopper layer 5 is formed by SiOx; or the gate isolation layer 3 is formed by SiOx and the etching stopper layer 5 is formed by Al₂O₃; in the manufacture process, a portion of the etching stopper layer 5 on the first electrode plate 31 is etched. Because the gate isolation layer 3 and the etching stopper layer 5 are formed by different materials, the etching gas of etching the etching stopper layer 5 is passive to the gate isolation layer 3, the gate isolation layer 3 under will not be damaged in the etching process of the etching stopper layer 5 and the well element property is preserved.

As shown in FIG. 3 which is a structure diagram of the second embodiment of the thin film transistor array substrate according to the present invention, comprising a substrate 1, a first gate 21, a second gate 22 and a first electrode plate 31 at one side of the second gate 22 away from the first gate 21 positioned on the substrate 1, a gate isolation layer 3 positioned on the first gate 21, the second gate 22 and the substrate 1, a first oxide semiconductor layer 41 and a second oxide semiconductor layer 42 respectively above the first gate 21 and the second gate 22 positioned on the gate isolation layer 3, an etching stopper layer 5 positioned on the first oxide semiconductor layer 41, the second oxide semiconductor layer 42, the gate isolation layer 3 and the first electrode plate 31, a second electrode plate 32 above the first electrode plate 31 positioned on the etching stopper layer 5, a first source 61, a first drain 62, a second source 63, a second drain 64 respectively above the first gate 21 and the second gate 22 positioned on the etching stopper layer 5, a passivation layer 71 positioned above the first source 61, the first drain 62, the second source 63, the second drain 64 and the second electrode plate 32 covering the etching stopper layer 5, a flat layer 72 positioned on the passivation layer 71, a pixel electrode layer 81 positioned on the flat layer 72, a pixel definition layer 9 positioned on the flat layer 72 and the pixel electrode layer 81 and a photospacer 91 positioned on the pixel definition layer 9.

The gate isolation layer 3 is provided with a first via hole 51 correspondingly above the second gate 22 close to one side of the first gate 21, and the passivation layer 71 and the flat layer 72 are provided with a second via hole 52 correspondingly above the second source 63, and the pixel definition layer 9 is provided with a third via hole 53 correspondingly above the pixel electrode layer 81; the first source 61, the first drain 62 contact with the first oxide semiconductor layer 41, and the second source 63 and the second drain 64 contact with the second oxide semiconductor layer 42, and the first source 61 contacts with the second gate 22 through the first via hole 51, and the pixel electrode layer 81 contacts with the second source 63 through the second via hole 52, and the third via hole 53 exposes a portion of the pixel electrode layer 81.

The first gate 21, the second gate 22, the gate isolation layer 3, the first oxide semiconductor layer 41, the second oxide semiconductor layer 42, the etching stopper layer 5, the first source 61, the first drain 62, the second source 63 and the second drain 64 construct a thin film transistor; the first electrode plate 31, the second electrode plate 32 and the etching stopper layer 5 between the first electrode plate 31 and the second electrode plate 32 construct a storage capacitor.

Because there is only one isolation layer, the etching stopper layer 5 existing between the two electrode plates of the storage capacitor, and in the manufacture process, a portion of the gate isolation layer 3 on the first electrode plate 31 is etched, the isolation layer thickness of the storage capacitor is thinner, and relatively, the capacitor occupies a smaller area and possesses a higher aperture ratio.

Preferably, there is only one isolation layer, the gate isolation layer 3 existing between the two electrode plates of the storage capacitor, which is the aforesaid first embodiment. Because in the second embodiment, if the portion of the gate isolation layer 3 on the first electrode plate 31 is etched, and no protection is applied to the first electrode plate 31 of the storage capacitor in the following process, which makes it easily be damaged, such as corrosion.

Because there is only one isolation layer, which is the gate isolation layer or the etching stopper layer, existing between the two electrode plates of the storage capacitor in the aforesaid thin film transistor array substrate, the isolation layer thickness of the storage capacitor is thinner, and relatively, the capacitor occupies a smaller area and possesses a higher aperture ratio.

Figure 4:
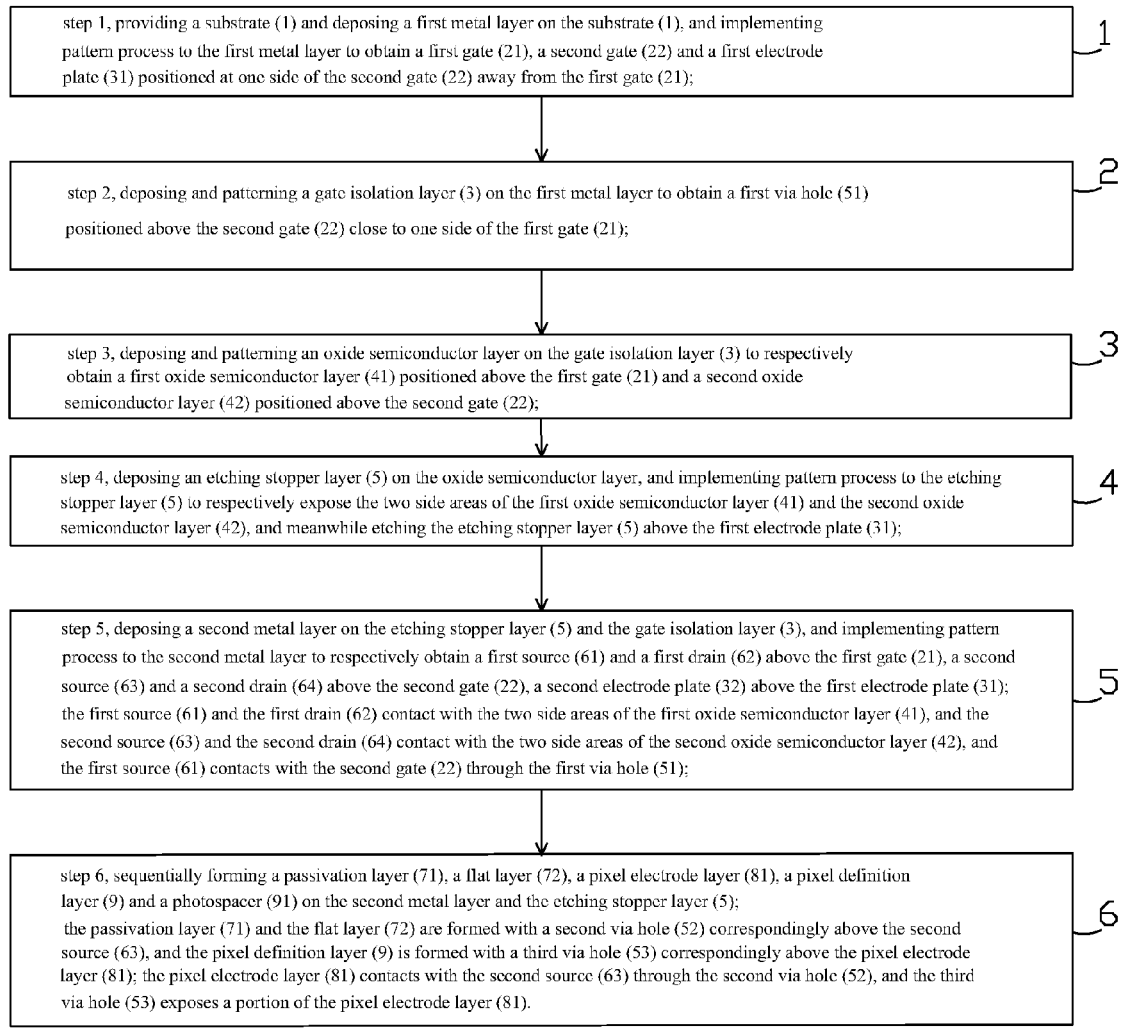
FIG. 4 is a flowchart of a manufacture method of a thin film transistor array substrate according to the present invention.

Please refer to FIG. 4 in combination with FIG. 2. The present invention further provides a manufacture method of a thin film transistor array substrate, comprising steps of:

step 1, providing a substrate 1 and deposing a first metal layer on the substrate 1, and implementing pattern process to the first metal layer to obtain a first gate 21, a second gate 22 and a first electrode plate 31 positioned at one side of the second gate 22 away from the first gate 21.

Specifically, the substrate 1 is a glass substrate or a plastic substrate.

step 2, deposing and patterning a gate isolation layer 3 on the first metal layer to obtain a first via hole 51 positioned above the second gate 22 close to one side of the first gate 21.

step 3, deposing and patterning an oxide semiconductor layer on the gate isolation layer 3 to respectively obtain a first oxide semiconductor layer 41 positioned above the first gate 21 and a second oxide semiconductor layer 42 positioned above the second gate 22.

step 4, deposing an etching stopper layer 5 on the oxide semiconductor layer, and implementing pattern process to the etching stopper layer 5 to respectively expose the two side areas of the first oxide semiconductor layer 41 and the second oxide semiconductor layer 42, and meanwhile etching the etching stopper layer 5 above the first electrode plate 31.

Specifically, the gate isolation layer 3 and the etching stopper layer 5 are formed by different materials; for example, the gate isolation layer 3 is formed by Al₂O₃ and the etching stopper layer 5 is formed by SiOx; or the gate isolation layer 3 is formed by SiOx and the etching stopper layer 5 is formed by Al₂O₃. The etching gas of etching the etching stopper layer 5 is passive to the gate isolation layer 3. Thus, the gate isolation layer 3 under will not be damaged in the etching process of the etching stopper layer 5 and the well element property is preserved.

step 5, deposing a second metal layer on the etching stopper layer 5 and the gate isolation layer 3, and implementing pattern process to the second metal layer to respectively obtain a first source 61 and a first drain 62 above the first gate 21, a second source 63 and a second drain 64 above the second gate 22, a second electrode plate 32 above the first electrode plate 31.

The first source 61 and the first drain 62 contact with the two side areas of the first oxide semiconductor layer 41, and the second source 63 and the second drain 64 contact with the two side areas of the second oxide semiconductor layer 42, and the first source 61 contacts with the second gate 22 through the first via hole 51.

step 6, sequentially forming a passivation layer 71, a flat layer 72, a pixel electrode layer 81, a pixel definition layer 9 and a photospacer 91 on the second metal layer and the etching stopper layer 5.

The passivation layer 71 and the flat layer 72 are formed with a second via hole 52 correspondingly above the second source 63, and the pixel definition layer 9 is formed with a third via hole 53 correspondingly above the pixel electrode layer 81; the pixel electrode layer 81 contacts with the second source 63 through the second via hole 52, and the third via hole 53 exposes a portion of the pixel electrode layer 81.

Specifically, all the passivation layer 71, the flat layer 72, the pixel electrode layer 81, the pixel definition layer 9 and the photospacer 91 can be manufactured with the present skills.

Significantly, as manufacturing the aforesaid thin film transistor array substrate, it can be another option to selectively etching the portion of the gate isolation layer 3 on the first electrode plate 31 to make only one isolation layer, the etching stopper layer 5 exist between the two electrode plates of the storage capacitor, to decrease the isolation layer thickness of the storage capacitor, and relatively, the capacitor occupies a smaller area and possesses a higher aperture ratio; however, the drawback of this manufacture method is that, no protection is applied to the first electrode plate 31 of the storage capacitor in the following process, which makes it easily be damaged, such as corrosion.

In the aforesaid manufacture method of the thin film transistor array substrate, as etching the etching stopper layer, the portion of the etching stopper layer on the first electrode plate is etched, and thus, the isolation layer thickness of the storage capacitor can be decreased, and relatively, the capacitor occupies a smaller area and possesses a higher aperture ratio; meanwhile, because the gate isolation layer and the etching stopper layer are formed by different materials, and the etching gas is passive to the gate isolation layer for preventing the damage to the gate isolation layer under in the process of etching the etching stopper layer, it can be ensured to obtain an ideal storage capacitor.

In conclusion, as regarding the thin film transistor array substrate provided by the present invention, because there is only one isolation layer, which is the gate isolation layer or the etching stopper layer, existing between the two electrode plates of the storage capacitor in the aforesaid thin film transistor array substrate, the isolation layer thickness of the storage capacitor is thinner, and relatively, the capacitor occupies a smaller area and possesses a higher aperture ratio. In the manufacture method of the thin film transistor array substrate according to the present invention, as etching the etching stopper layer, the portion of the etching stopper layer on the first electrode plate is etched, and thus, the isolation layer thickness of the storage capacitor can be decreased, and relatively, the capacitor occupies a smaller area and possesses a higher aperture ratio; meanwhile, because the gate isolation layer and the etching stopper layer are formed by different materials, and the etching gas is passive to the gate isolation layer for preventing the damage to the gate isolation layer under in the process of etching the etching stopper layer, it can be ensured to obtain an ideal storage capacitor.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A thin film transistor array substrate, comprising a substrate having a surface and a first thin film transistor and a storage capacitor formed on the surface of the substrate;
    wherein the first thin film transistor comprises a first gate formed on the surface of the substrate and the storage capacitor comprises a first electrode plate formed on the surface of the substrate and spaced from the first gate by a predetermined distance along the surface of the substrate, a gate isolation layer formed on the surface of the substrate, the first gate, and the first electrode plate so as to cover the first gate and the first electrode plate such that the gate isolation layer comprises a raised portion located on first electrode plate by being raised above a top surface of the gate isolation layer around the first electrode plate;
    wherein the first thin film transistor further comprises a first oxide semiconductor layer formed on the gate isolation layer and located above and corresponding to the first gate; and
    wherein an etching stopper layer is formed on the gate isolation layer and the first oxide semiconductor layer and comprises a first part that covers the first oxide semiconductor layer and a second part that extends from the first part and the top surface of the gate isolation layer and covers the gate isolation layer, the first part of the etching stopper layer being formed with openings in which a first drain and a first source of the first thin film transistor are formed and in electrical connection with the first oxide semiconductor layer, the second part of the etching stopper layer being formed with an opening corresponding to and exposing a top of the raised portion of the gate isolation layer such that a top of the second part of the etching stopper layer is substantially flush with the top of the raised portion of the gate isolation layer, a second electrode plate of the storage capacitor being formed on and in direct contact with the exposed top of the raised portion of the gate isolation layer and corresponding to the first electrode plate.

2. The thin film transistor array substrate according to claim 1, further comprising a second thin film transistor that comprises a second gate formed on the surface of the substrate in a space defined by the distance between the first electrode plate and the first gate, the gate isolation layer being positioned on and covering the first gate, the second gate, the first electrode plate and the substrate, the second thin film transistor comprising a second oxide semiconductor layer formed on the gate isolation layer and located above and corresponding to the second gate, the etching stopper layer being positioned on the first oxide semiconductor layer, the second oxide semiconductor layer and the gate isolation layer to additionally cover the second oxide semiconductor with additional openings formed therein, a second source and a second drain of the second thin film transistor being respectively formed in the additional openings of the etching stopper layer and in electrical connection with the second oxide semiconductor layer;
    wherein the gate isolation layer is provided with a first via hole corresponding to and exposing a portion of the second gate such that the first source contacts with the second gate through the first via hole.

3. The thin film transistor array substrate according to claim 1, wherein comprising a substrate, a first gate, a second gate and a first electrode plate at one side of the second gate away from the first gate positioned on the substrate, a gate isolation layer positioned on the first gate, the second gate and the substrate, a first oxide semiconductor layer and a second oxide semiconductor layer respectively above the first gate and the second gate positioned on the gate isolation layer, an etching stopper layer positioned on the first oxide semiconductor layer, the second oxide semiconductor layer, the gate isolation layer and the first electrode plate, a second electrode plate above the first electrode plate positioned on the etching stopper layer, a first source, a first drain, a second source, a second drain respectively above the first gate and the second gate positioned on the etching stopper layer, a passivation layer positioned above the first source, the first drain, the second source, the second drain and the second electrode plate covering the etching stopper layer, a flat layer positioned on the passivation layer, a pixel electrode layer positioned on the flat layer, a pixel definition layer positioned on the flat layer and the pixel electrode layer and a photospacer positioned on the pixel definition layer;

the gate isolation layer is provided with a first via hole correspondingly above the second gate close to one side of the first gate, and the passivation layer and the flat layer are provided with a second via hole correspondingly above the second source, and the pixel definition layer is provided with a third via hole correspondingly above the pixel electrode layer; the first source, the first drain contact with the first oxide semiconductor layer, and the second source and the second drain contact with the second oxide semiconductor layer, and the first source contacts with the second gate through the first via hole, and the pixel electrode layer contacts with the second source through the second via hole, and the third via hole exposes a portion of the pixel electrode layer;

the first gate, the second gate, the gate isolation layer, the first oxide semiconductor layer, the second oxide semiconductor layer, the etching stopper layer, the first source, the first drain, the second source and the second drain construct a thin film transistor; the first electrode plate, the second electrode plate and the etching stopper layer between the first electrode plate and the second electrode plate construct a storage capacitor.

4. The thin film transistor array substrate according to claim 1, wherein a material of the gate isolation layer and a material of the etching stopper layer are different.

5. The thin film transistor array substrate according to claim 3, wherein materials of the gate isolation layer and the etching stopper layer are different.

6. The thin film transistor array substrate according to claim 4, wherein the material of the gate isolation layer is $Al_2O_3$, and the material of the etching stopper layer is SiOx.

7. The thin film transistor array substrate according to claim 4, wherein the material of the gate isolation layer is SiOx, and the material of the etching stopper layer is $Al_2O_3$.

8. The thin film transistor array substrate according to claim 5, wherein material of the gate isolation layer is $Al_2O_3$, and material of the etching stopper layer is SiOx.

9. The thin film transistor array substrate according to claim 5, wherein material of the gate isolation layer is SiOx, and material of the etching stopper layer is $Al_2O_3$.

10. The thin film transistor array substrate according to claim 2 further comprising a passivation layer formed on the first source, the first drain, the second source, the second drain and the second electrode plate and covering the etching stopper layer, a flat layer positioned on the passivation layer, a pixel electrode layer positioned on the flat layer, a pixel definition layer positioned on the flat layer and the pixel electrode layer and a photospacer positioned on the pixel definition layer, wherein the passivation layer and the flat layer comprise a second via hole formed therethrough to correspond to the second source such that the pixel electrode layer extend through the second via hole to contact with the second source; and wherein the pixel definition layer comprises a third via hole formed therethrough to correspond to the pixel electrode layer so as to expose a portion of the pixel electrode layer.

* * * * *